United States Patent
Yeh

(10) Patent No.: US 8,139,428 B2
(45) Date of Patent: Mar. 20, 2012

(54) METHOD FOR READING AND WRITING A BLOCK INTERLEAVER AND THE READING CIRCUIT THEREOF

(75) Inventor: Shih Yi Yeh, Jhubei (TW)

(73) Assignee: Ralink Technology Corporation, Jhubei, Hsinchu County (TW)

( * ) Notice: Subject to any disclaimer, the term of this patent is extended or adjusted under 35 U.S.C. 154(b) by 236 days.

(21) Appl. No.: 12/498,981

(22) Filed: Jul. 7, 2009

(65) Prior Publication Data
US 2010/0110804 A1    May 6, 2010

(30) Foreign Application Priority Data
Nov. 4, 2008    (TW) ............................... 97142446 A

(51) Int. Cl.
G11C 7/00    (2006.01)
(52) U.S. Cl. .............................. 365/189.15; 365/185.09

(58) Field of Classification Search ............. 365/185.09, 365/189.011, 189.15
See application file for complete search history.

(56) References Cited

U.S. PATENT DOCUMENTS
6,981,175 B2 * 12/2005 Vollrath et al. ............... 714/6.32
6,986,081 B1 * 1/2006 Furutani ....................... 714/701

FOREIGN PATENT DOCUMENTS
TW    1294221    3/2008
* cited by examiner

*Primary Examiner* — VanThu Nguyen
(74) *Attorney, Agent, or Firm* — Hamre, Schumann, Mueller & Larson, P.C.

(57) ABSTRACT

A method for writing a memory of a block interleaver determines in a bit-wise manner whether to write data into the memory. A method for reading a memory of a block interleaver combines two adjacent columns of the memory into a temporary column and reads data from the temporary column.

12 Claims, 9 Drawing Sheets

METHOD FOR READING AND WRITING A BLOCK INTERLEAVER AND THE READING CIRCUIT THEREOF

BACKGROUND OF THE INVENTION

1. Field of the Invention

The present invention relates to a method for writing and reading a memory, and more particularly, to a method for writing and reading a memory of a block interleaver.

2. Description of the Related Art

Error-correction codes are often used in digital communication systems to correct errors produced during data transmission. Generally speaking, the number of errors an error-correction code can correct for a certain amount of data is limited. For example, a (7, 4) Hamming code can only correct 1 bit of error or detect 2 bits of errors per 7 bits of input data. However, a burst error, or a sequence of errors, often occurs during data transmission such that the number of errors is beyond an error-correction code's capability. Accordingly, most digital communication systems utilize interleaver systems, such as block interleaves, to redistribute the sequence of errors such that those errors are distributed more evenly, and the error-correction code can therefore effectively correct those errors.

FIG. 1 shows the block diagram of a block interleaver. As shown in FIG. 1, the block interleaver 100 comprises a memory 110 and a combinational circuit 120. The size of the memory 110 is $N_r$ rows by $N_c$ columns. The effective size of the memory 110 varies for different transmission requirements. Therefore, it is not necessary for the memory 110 to use all of its capacity during read/write operation. Data is transversally written to the memory 110 and vertically read from the memory 110 such that the data is interleaved. Generally, the memory 110 is realized by registers, and the read and write operation of the memory 110 is controlled by the combinational circuit 120.

FIG. 2 shows the flow chart of a conventional method for writing a memory of a block interleaver, wherein the size of the memory is $N_r$ rows by $N_c$ columns, and the method writing a datum of $N_{BPSC}$ bits transversally into the memory with a start address of the r-th row and the c-th column of the memory. In step 210, a first temporary row with length $N_c$ bits is established, wherein $N_{BPSC}$ entries starting from the c-th entry of the first temporary row are marked as 1, and the other entries of the first temporary row are marked as 0. In step 220, the datum with the length of $N_{BPSC}$ bits is expanded to a second temporary row with length of $N_c$ bits such that the least significant bit of the datum is mapped to the c-th entry of the second temporary row, and the remaining entries are marked as 0. In step 230, the r-th row of the memory is read, and AND operations are executed to each bit of the r-th row of the memory with each bit of the first temporary row to generate a third temporary row. In step 240, OR operations are executed to each bit of the second temporary row with each bit of the third temporary row, and the result is written to the r-th row of the memory.

The realization of the aforementioned writing method incurs significant hardware costs. For example, step 230 requires a multiplexer with $N_r$ inputs terminal to read the r-th row of the memory, and each input datum of the multiplexer is $N_c$ bits in length. Therefore, the multiplexer comprises a majority of the area of the writing circuit of the block interleaver. In addition, in steps 230 and 240, an AND gate and an OR gate with length $N_c$ bits are required respectively such that the area of the writing circuit is further increased.

FIG. 3 shows the flow chart of a conventional method for reading a memory of a block interleaver, wherein the size of the memory is $N_r$ rows by $N_c$ columns, the effective size of the memory is $M_r$ rows by $M_c$ columns, and the method includes reading a datum of $N_{BPSC}$ bits vertically from the memory with a start address of the r-th row and the c-th column of the memory. However, the effective size of the memory might be smaller than the real size of the memory, and the datum to be read might be divided into two columns. Therefore, the reading method determines the corresponding addresses of each bit individually based on several criteria. In step 310, the bit stored in the entry of r-th row and the c-th column of the memory is read as the first bit of the datum. In step 320, the corresponding address of each bit from the second to the $N_{BPSC}$ bit of the datum is determined. In step 330, the bits stored in the entries corresponding to the determined address are read as the second to the $N_{BPSC}$ bit of the datum. The criteria for the determination of the addresses are as follows: to determine the corresponding address of the m-th bit of the datum, wherein $2 \leq m \leq N_{BPSC}$, check whether r+m−1 is equal to or smaller than $M_r$. If r+m−1 is equal to or smaller than $M_r$, then the bit stored in the entry of the (r+m−1)-th row and the (c+1)-th column of the memory is read as the m-th bit of the datum. If r+m−1 is greater than $M_r$, then check whether c+1 is equal to or smaller than $M_c$. If c+1 is equal to or smaller than $M_c$, then the bit stored in the entry of the (r+m−1−$M_r$)-th row and the (c+1)-th column of the memory is read as the m-th bit of the datum. If c+1 is greater than $M_c$, then the bit stored in the entry of the (r+m−1−$M_r$)-th row and the first column of the memory is read as the m-th bit of the datum.

The realization of the aforementioned reading method incurs significant hardware costs. For example, step 320 requires many addition and subtraction operations and determination criteria for each bit of the datum such that the area of the reading circuit of the block interleaver is significantly increased.

In conclusion, the hardware cost and space required for the memory of a block interleaver are limited and fixed, and the structure of the combinational circuit of the block interleaver is based on the writing and reading method of the block interleaver. Therefore, there is a need to design writing and reading methods for a block interleaver with low complexity to reduce the hardware requirement of the block interleaver.

SUMMARY OF THE INVENTION

The method for writing a memory of a block interleaver according to the first embodiment of the present invention, the method is to write a datum of $N_{BPSC}$ bits transversally into the memory with a start address of the r-th row and the c-th column of the memory, wherein the size of the memory is $N_r$ rows by $N_c$ columns, and $N_r$, $N_c$, $N_{BPSC}$, r and c are all positive integers, the method comprising the steps of: marking sequentially $N_{BPSC}$ entries of a first temporary row starting from the c-th entry as to be written to, and marking other entries of the first temporary row as not to be written to; and writing the corresponding bit of the datum into the corresponding entry of the memory if the corresponding entry of the first temporary row is marked as to be written to.

The method for reading a memory of a block interleaver according to the second embodiment of the present invention, where the size of the memory is $N_r$ rows by $N_c$ columns and the effective size of the memory is $M_r$ rows by $M_c$ columns, the method is to read a datum of $N_{BPSC}$ bits vertically from the memory with a start address of the r-th row and the c-th column of the memory, wherein $N_r$, $N_c$, $N_{BPSC}$, r and c are all positive integers, the method comprising the steps of: combining all of the bits in the c-th column and the first several bits of the next column into a first combination column; combining the first $M_r$ bits of the first combination column and the last several bits of the first combination column into a second combination column; and reading $N_{BPSC}$ bits of the second combination column starting from the r-th bit.

BRIEF DESCRIPTION OF THE DRAWINGS

The objectives and advantages of the present invention will become apparent upon reading the following description and upon referring to the accompanying drawings of which.

DETAILED DESCRIPTION OF THE INVENTION

Figure 1:
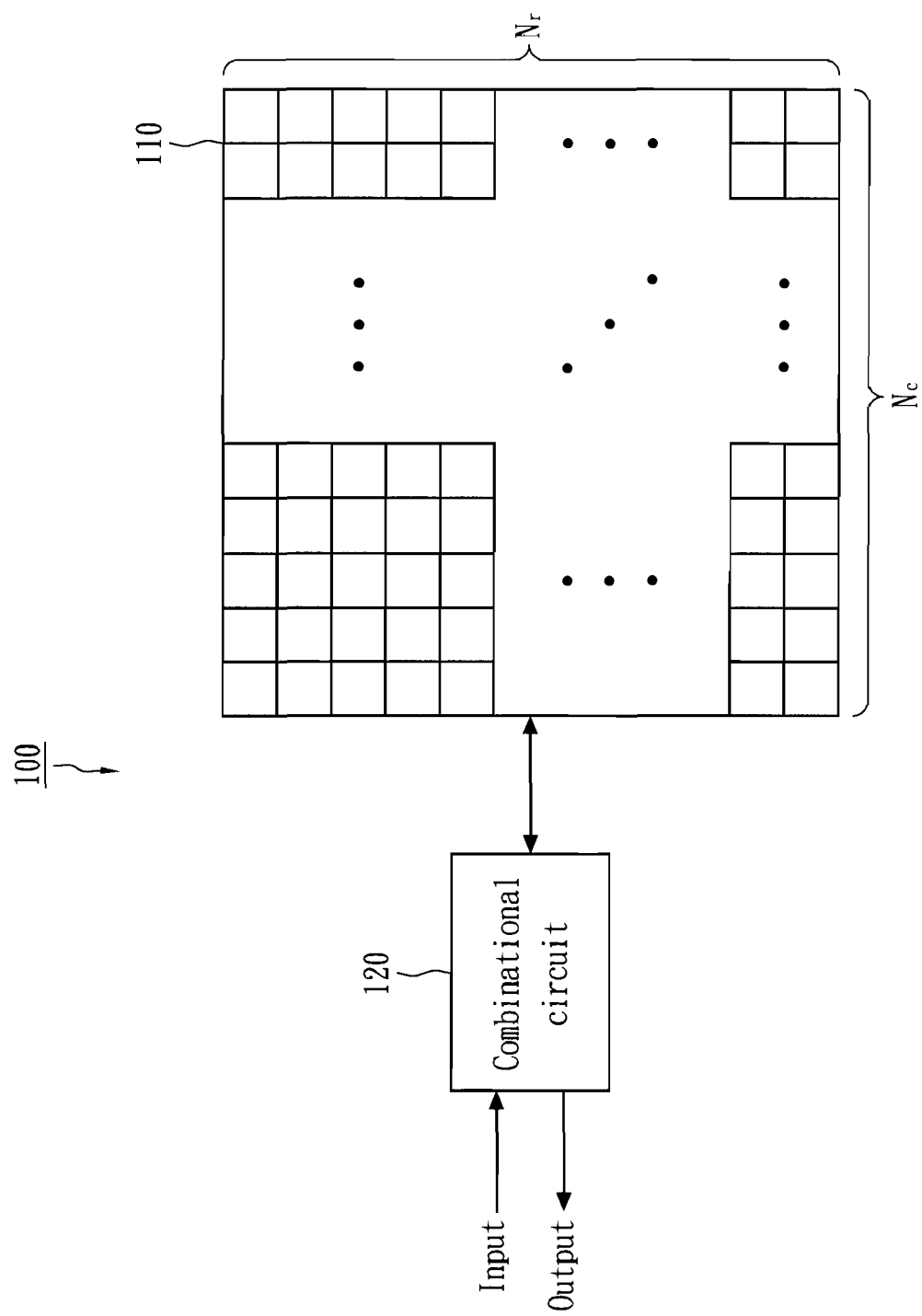
FIG. 1 shows the block diagram of a block interleaver.
Figure 2:
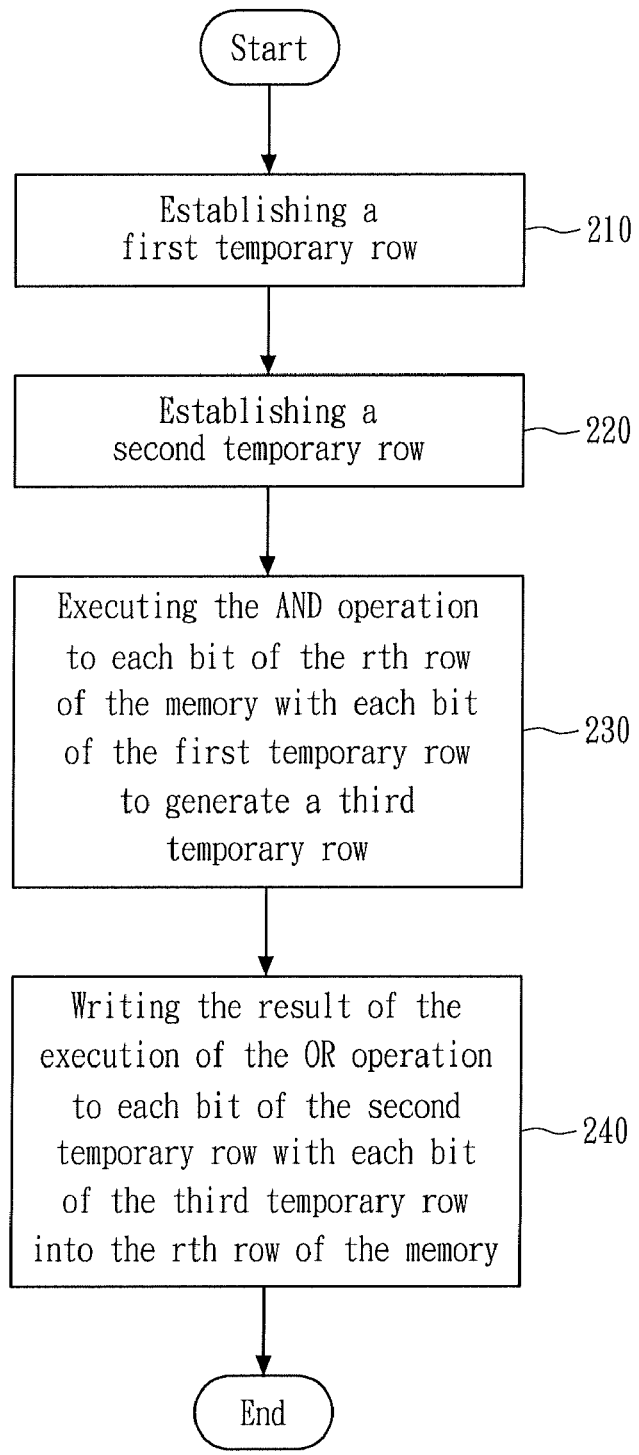
FIG. 2 shows the flow chart of a conventional method for writing a memory of a block interleaver.

The conventional writing method for a block interleaver shown in FIG. 2 reads the entire row where the datum is to be written to, covers the portions not to be overwritten, substitutes the data into the uncovered portion, and writes the entire row back into the memory. In other words, the conventional writing method writes data row-wise, that is, it groups together the data to be written with the original data in the row where the data is to be written to, and writes the grouped data into the row. Such inefficient method necessitates more expensive hardware. In contrast, the embodiments of the present invention write data bit-wise to reduce the hardware cost.

Figure 4:
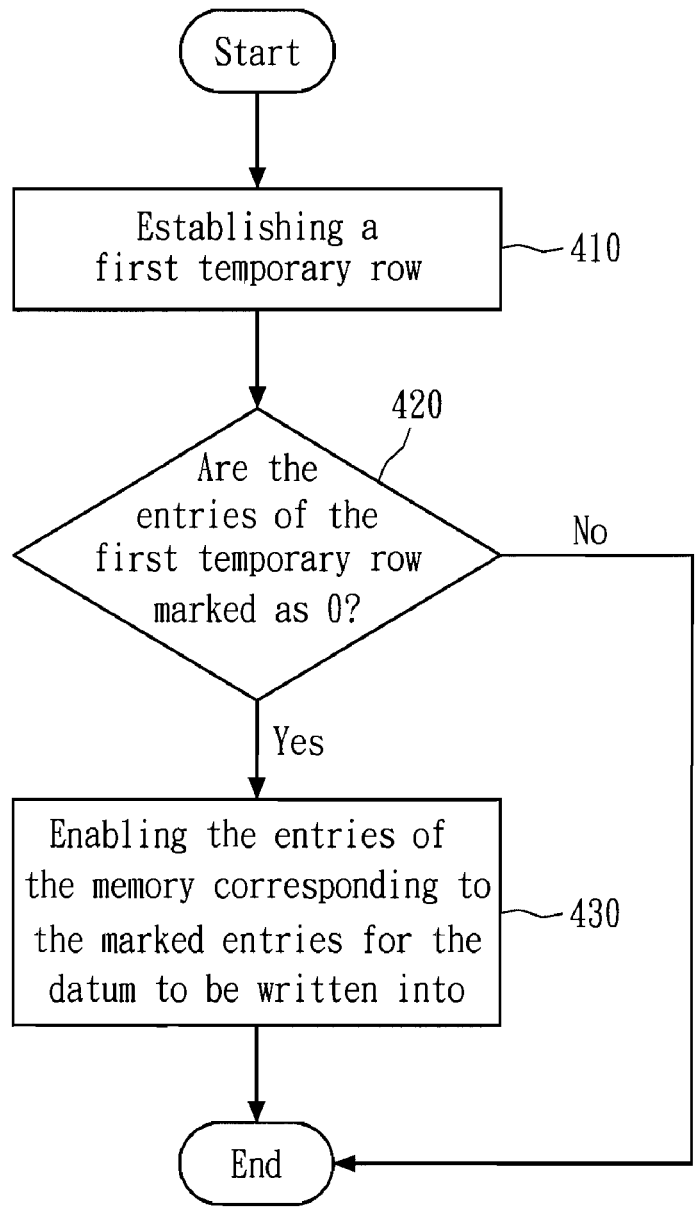
FIG. 4 shows the flow chart of the first embodiment of the method for writing a memory of a block interleaver of the present invention.

FIG. 4 shows the flow chart of the first embodiment of the method for writing a memory of a block interleaver of the present invention, the method is to write a datum of $N_{BPSC}$ bits transversally into the memory with a start address of the r-th row and the c-th column of the memory, wherein the size of the memory is $N_r$ rows by $N_c$ columns. In step 410, a first temporary row with length $N_c$ bits is established, wherein $N_{BPSC}$ entries starting from the c-th entry of the first temporary row are marked as 1, and the other entries of the first temporary row are marked as 0. In step 420, each entry of the first temporary row is checked. If the checked entry is marked as 1, then step 430 is executed, and the existing entries of the memory corresponding to the marked entries are enabled for the data to be written to; otherwise, if the checked entry is not marked as 1, then the corresponding entries of the memory are disabled. In step 430, the datum to be written with length of $N_{BPSC}$ bits is expanded into a second temporary row with length of $N_c$ bits, such that the least significant bit of the datum is mapped to the c-th entry of the second temporary row, and the remaining entries are marked as 0. If one entry of the first temporary row is marked as 1, then the bit in the corresponding entry of the second temporary row is written to the corresponding entry (column) and the r-th row of the memory.

Figure 5A:
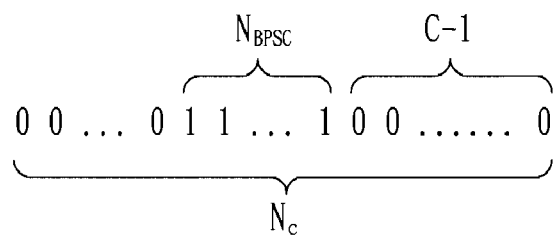
FIGS. 5A and 5B show the data structure in the first embodiment of the present invention.
Figure 5B:
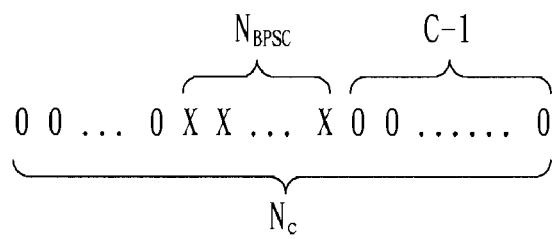

A hardware description language can describe the writing method of the first embodiment as follows:

```
for (i=0~Nr−1)
    if (wmask[i]) M[r'][i] = shifted_bits_in[i];
wmask = (NBPSC'b11..1 << c')
shifted_bits_in = (bits_in << c');
``` wherein c'=c−1, r'=r−1, wmask is the first temporary row, shifted_bits_in is the second temporary row, bits_in is the data to be written, and M represents the matrix of the memory. FIGS. 5A and 5B show the data structure of the first and the second temporary rows, respectively.

Compared with the conventional writing method, the writing method of the first embodiment offers a significant reduction in hardware cost. Particularly, the writing method of the first embodiment writes data in bit-wise. Therefore, only $N_{BPSC}$ write operations are executed. Compared with the conventional writing method, which requires $N_C$ write operations, the method of the first embodiment reduces the number of multiplexers required. Further, the memory in the first embodiment is utilized by D flip-flops. Typically, a D flip-flop has an enable input terminal. The check operation in step 420 is realized at the enable input terminals of the D flip-flops such that the characteristics of the D flip-flops are fully utilized to further reduce the hardware cost.

Figure 3:
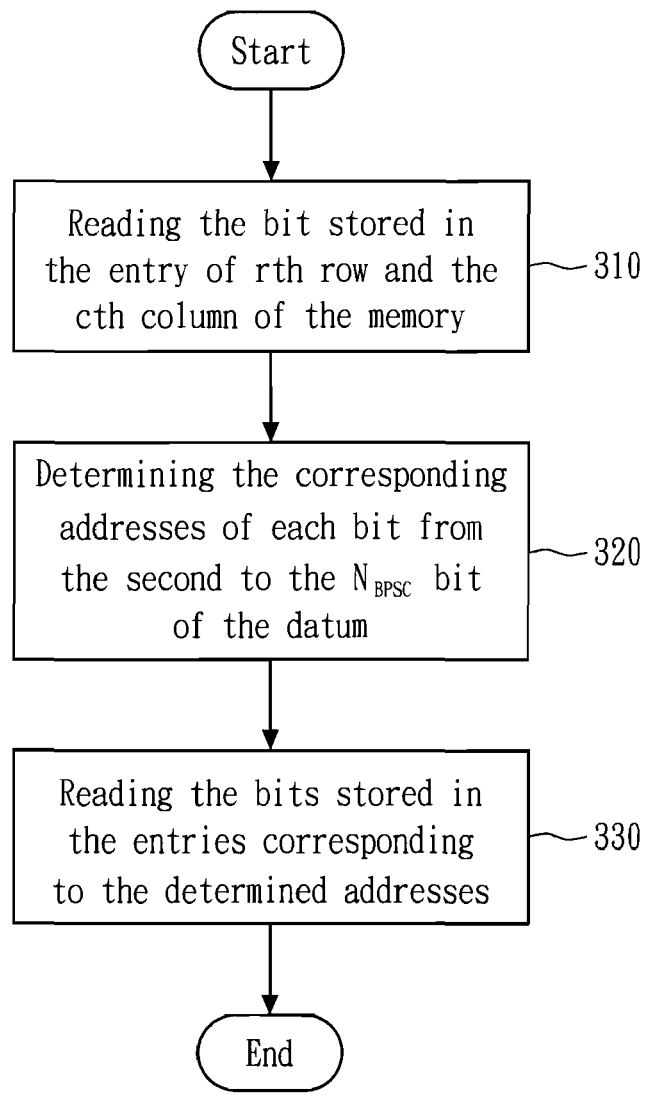
FIG. 3 shows the flow chart of a conventional method for reading a memory of a block interleaver.

The conventional reading method for a block interleaver shown in FIG. 3 determines the corresponding addresses of each bit of the data individually such that a large amount of addition and subtraction operations and determination criteria are required. The embodiments of the present invention read data in column-wise. That is, the embodiments of the present invention read the entire column to which the entries of the data are to be written to, combine the entire column with the first $N_n$ bits stored in the next column, wherein $N_n$ is no greater than $N_{BPSC}-1$, and read datum from the combined column. Therefore, the embodiments of the present invention eliminate the addition and subtraction operations and determination criteria required in the conventional reading method, and thus reduce a significant amount of hardware cost.

Figure 6:
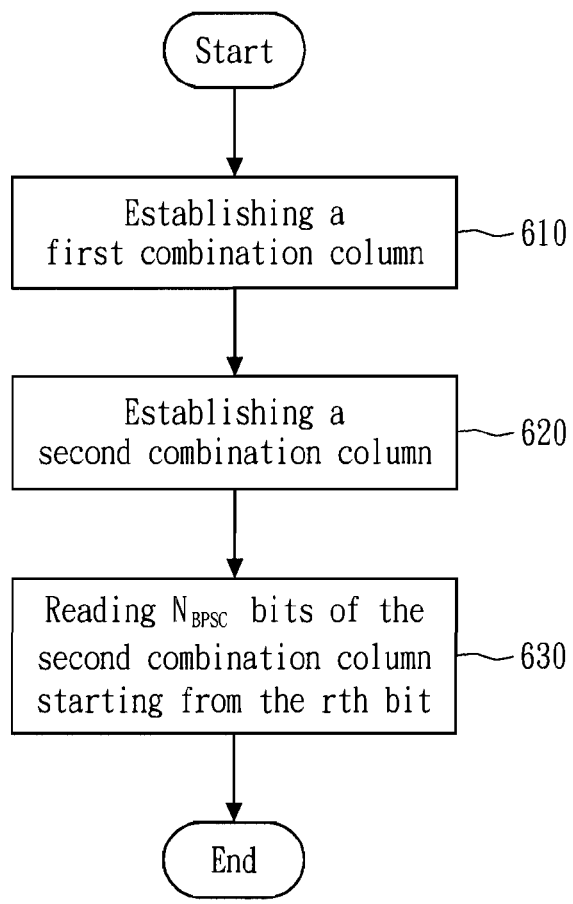
FIG. 6 shows the flow chart of the second embodiment of the method for reading a memory of a block interleaver of the present invention.

FIG. 6 shows the flow chart of the second embodiment of the method for reading a memory of a block interleaver of the present invention, wherein the size of the memory is $N_r$ rows by $N_c$ columns, the effective size of the memory is $M_r$ rows by $M_c$ columns, and the method is to read a datum of $N_{BPSC}$ bits vertically from the memory with a start address of the r-th row and the c-th column of the memory. In step 610, all of the bits in the c-th column and the first $N_n$ bits of the next column are combined into a first combination column. In step 620, the first $M_r$ bits of the first combination column and the last $N_n$ bits of the first combination column are combined into a second combination column. In step 630, $N_{BPSC}$ bits of the second combination column starting from the r-th bit are read as the datum.

The reading method of the second embodiment is further described as follows. In step 610, check whether c+1 is greater than $M_c$ to see if the next column (following the column where the entries of the data are to be written to) exceeds the effective column of the memory and jumps back to the first column. If c+1 is equal to or smaller than $M_c$, then the first $N_n$ bits of the (c+1)-th column are read. Otherwise, the first $N_n$ bits of the first column are read. In step 620, a first temporary column with length $N_r+N_n$ is established, wherein $N_{BPSC}$ bits starting from the $M_r$-th bit are marked as 0, and the other bits are marked as 1. Then, AND operations are executed for each bit of the first combination column with each bit of the first temporary column, such that the $M_r$-th bit to the $(M_r+N_{BPSC}-1)$-th bit of the first combination column are 0, and the other bits remains the same. Afterward, OR operations are executed for each bit between the $(N_r+N_{BPSC}-1)$-th bit and the $N_r$-th bit of the first combination column with each bit between the $(M_r+N_{BPSC}-1)$-th bit and the $M_r$-th bit of the first combination column to generate a second combination column. In step 630, the second combination column is shifted to the right by r bits, and the $N_{BPSC}$-th bit to the first bit of the shifted second combination column is read as the datum.

Figure 7A:
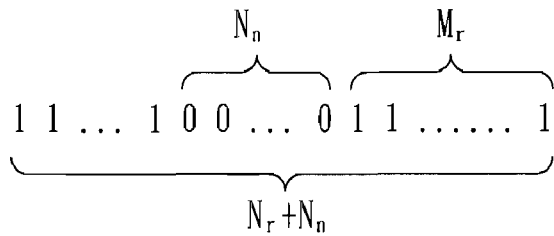
FIGS. 7A to 7E show the data structure in the second embodiment of the present invention.
Figure 7B:
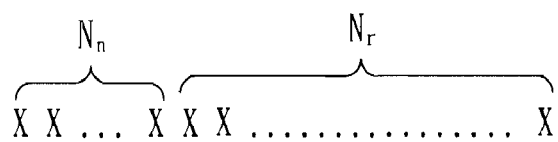
Figure 7C:
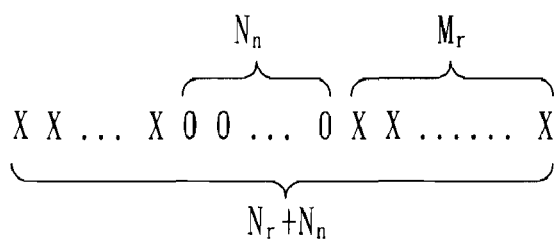
Figure 7D:
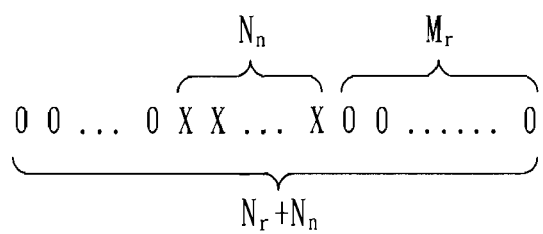
Figure 7E:
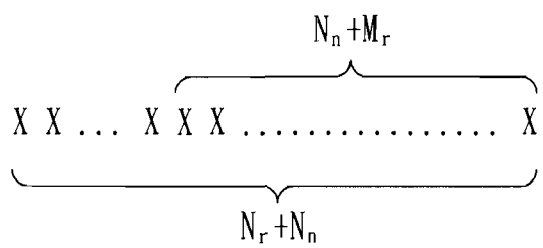

A hardware description language can describe the reading method of the second embodiment as follows:

```
col[Nr−1:0] = M[Nr−1:0][c'];
if (c'+1<Mr) col[Nr+Nn−1:Nr] = M[Nn−1:0][c'+1];
else col[Nr+Nn−1:Nr] = M[Nn−1:0][0];
packed_col = (col&rmask)|(col[Nr+Nn−1:Nr] << Mr);
bits_out = packed_col >> r';
rmask =~ (NBPSC'b11..1<<Mr);
``` wherein $c'=c-1$, $r'=r-1$, $N_n \leq N_{BPSC}-1$, rmask is the first temporary column, col is the first combination column, packed_col is the second combination column, bits_out is the datum to read, and M represents the matrix of the memory. FIG. 7A shows the data structure of the first temporary column. FIG. 7B shows the data structure of the first combination column. FIG. 7C shows the data structure of the result after the AND operation between the first temporary column and the first combination column. FIG. 7D shows the data structure to be executed by the OR operation with the data structure shown in FIG. 7C, wherein the data structure shown in FIG. 7D is constructed by shifting the bits between the $(N_r+N_n-1)$-th bit and the $N_r$-th bit to between the $(M_r+N_n-1)$-th bit and the $M_r$-th bit, and the other bits are 0. FIG. 7E shows the data structure of the second combination column, wherein the r-th bit to the $(r+N_{BPSC}-1)$-th bit are the data to be read.

In conclusion, compared with the conventional reading method, the reading method of the second embodiment reduces the number of required addition and subtraction operations and criteriaima applied for the determination of the corresponding addresses down to 1. Therefore, compared with the conventional reading method, the reading method of the second embodiment saves significant hardware cost.

Figure 8:
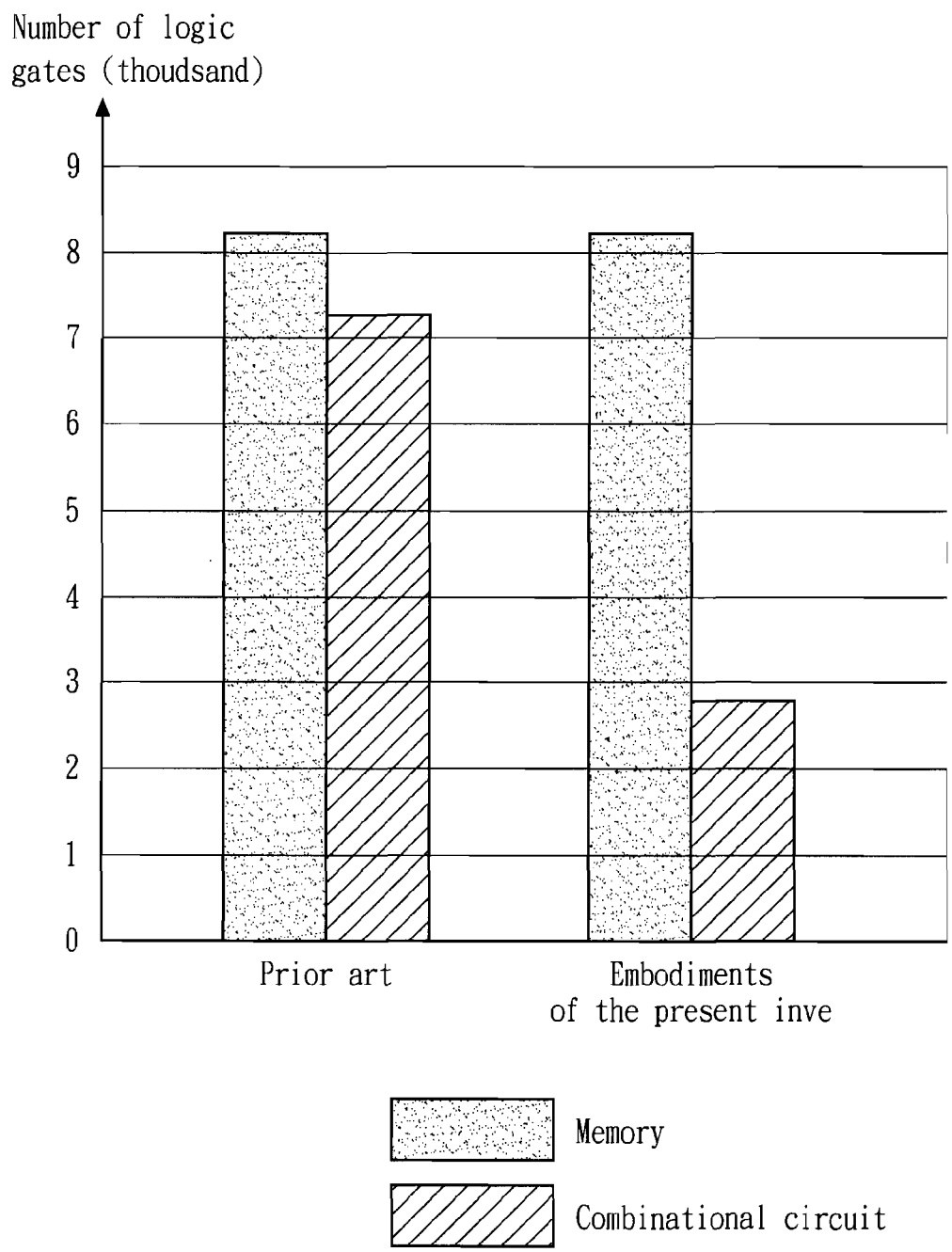
FIG. 8 shows the hardware comparison between the conventional writing and reading method for a block interleaver and the method described in the embodiments of the present invention.

FIG. 8 shows the hardware comparison between the conventional writing and reading methods of a block interleaver and the method described in the embodiments of the present invention. As shown in FIG. 8, the ratio of the area of the combinational circuit of the embodiments of the present invention to that of the conventional writing and reading methods is 2.6. In other words, compared with the conventional methods, the reading and writing method of the present invention for a block interleaver significantly reduces the complexity of the combinational circuit, and the corresponding hardware area is also significantly reduced such that it is much suited to modern circuit design requirements.

The above-described embodiments of the present invention are intended to be illustrative only. Those skilled in the art may devise numerous alternative embodiments without departing from the scope of the following claims.

What is claimed is:

1. A method for reading a memory of a block interleaver, wherein the size of the memory is $N_r$ rows by $N_c$ columns, the effective size of the memory is $M_r$ rows by $M_c$ columns, the method reading a datum of $N_{BPSC}$ bits vertically from the memory with a start address of a r-th row and a c-th column of the memory, wherein $N_r$, $N_c$, $N_{BPSC}$, r and c are all positive integers, the method comprising the steps of:
    combining all bits in the c-th column and first several bits of a next column into a first combination column;
    combining first $M_r$ bits of the first combination column and last several bits of the first combination column into a second combination column; and
    reading $N_{BPSC}$ bits of the second combination column starting from a r-th bit.

2. The method of claim 1, wherein the number of the several bits is $N_n-1$, and $N_n \leq N_{BPSC}-1$.

3. The method of claim 1, wherein the step of the combination of the first combination column comprises the steps of:
    reading the first several bits of the next column if c+1 is equal to or smaller than $M_c$; and
    reading the first several bits of the first column if c+1 is greater than $M_c$.

4. The method of claim 1, wherein the step of the combination of the second combination column comprises the steps of:
    marking $N_n$ bits of a first temporary column with length $N_r+N_n$ starting from a $M_r$-th bit as to be written to, and marking the other bits as not to be written to;
    executing AND operations for each bit of the first combination column with each bit of the first temporary column; and
    executing OR operations for each bit between a $(N_r+N_n-1)$-th bit and a $N_r$-th bit of the first combination column with each bit between a $(M_r+N_n-1)$-th bit and the $M_r$-th bit of the first combination column.

5. The method of claim 1, wherein the step of reading $N_{BPSC}$ bits of the second combination column comprises the steps of:
    shifting the second combination column by r bits to the right and reading bits between a $N_{BPSC}$-th bit and the first bit of second combination column as the datum.

6. The method of claim 1, wherein the memory is realized by flip-flops.

7. A read circuit for a memory of a block interleaver, wherein the size of the memory is $N_r$ rows by $N_c$ columns, the effective size of the memory is $M_r$ rows by $M_c$ columns, the read circuit reading a datum from the memory to a specific data structure and outputting $N_{BPSC}$ bits vertically from the memory with a start address of a r-th row and a c-th column of the memory, wherein $N_r$, $N_c$, $N_{BPSC}$, r and c are all positive integers, the data structure comprising:
    a first combination column constructed by combining all bits in a c-th column and first several bits of a next column of the memory; and
    a second combination column constructed by combining first $M_r$ bits of the first combination column and last several bits of the first combination column;
    wherein the second combination column is input data of the read circuit, and bits between a r-th bit and a $(r+N_{BPSC}-1)$-th bit are output data of the read circuit.

8. The read circuit of claim 7, wherein the number of the several bits is $N_n$, and $N_n \leq N_{BPSC}-1$.

9. The read circuit of claim 7, wherein the length of the first combination column and that of the second combination column are the same.

10. The read circuit of claim 7, wherein the data structure further comprises:
- a first temporary column with length $N_r+N_n$, having $N_{BPSC}$ bits starting from a $M_r$-th bit marked as zero and the other bits marked as one;
- a second temporary column with length $N_r+N_n$, constructed by executing AND operations for each bit of the first combination column with each bit of the first temporary column; and
- a third temporary column with length $N_r+N_n$, constructed by executing OR operations for each bit between a $(N_r+N_n-1)$-th bit and a $N_r$-th bit of the first combination column with each bit between a $(M_r+N_n-1)$-th bit and the $M_r$-th bit of the second temporary column.

11. The read circuit of claim 10, wherein the second combination column is third temporary column.

12. The read circuit of claim 7, wherein the memory is realized by flip-flops.

* * * * *